United States Patent
Ye

(10) Patent No.: US 8,809,132 B2
(45) Date of Patent: *Aug. 19, 2014

(54) CAPPING LAYERS FOR METAL OXYNITRIDE TFTS

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 498 days.

This patent is subject to a terminal disclaimer.

(21) Appl. No.: 13/215,013

(22) Filed: Aug. 22, 2011

(65) Prior Publication Data

US 2011/0306169 A1    Dec. 15, 2011

Related U.S. Application Data

(63) Continuation of application No. 12/493,718, filed on Jun. 29, 2009, now Pat. No. 8,012,794.

(60) Provisional application No. 61/117,744, filed on Nov. 25, 2008, provisional application No. 61/117,747, filed on Nov. 25, 2008, provisional application No. 61/077,831, filed on Jul. 2, 2008.

(51) Int. Cl.
*H01L 21/00* (2006.01)
*H01L 21/84* (2006.01)
*H01L 29/786* (2006.01)
*H01L 21/02* (2006.01)

(52) U.S. Cl.
CPC ...... *H01L 29/7869* (2013.01); *H01L 21/02631* (2013.01); *H01L 21/02554* (2013.01); *H01L 21/02565* (2013.01); *H01L 21/02521* (2013.01)
USPC ............... 438/149; 438/9; 438/513; 438/753; 257/E21.006; 257/E21.007; 257/E21.043; 257/E21.051; 257/E21.077; 257/E21.085; 257/E21.129; 257/E21.17; 257/E21.249; 257/E21.267; 257/E21.311; 257/E21.312; 257/E21.319; 257/E21.321

(58) Field of Classification Search
USPC ......... 438/149, 29, 30, 93, 99, 104, 174, 474, 438/475, 510, 513, 753; 257/E21.006, 257/E21.007, E21.043, E21.051, E21.077, 257/E21.085, E21.129, E21.17, E21.249, 257/E21.267, E21.311, E21.312, E21.319, 257/E21.321
See application file for complete search history.

(56) References Cited

U.S. PATENT DOCUMENTS

| 4,436,770 A | 3/1984 | Nishizawa et al. |
| 4,695,432 A | 9/1987 | Colin et al. |

(Continued)

FOREIGN PATENT DOCUMENTS

| CN | 1588623 A | 3/2005 |
| CN | 1700428 A | 11/2005 |

(Continued)

OTHER PUBLICATIONS

Taiwan office action dated Dec. 27, 2013 for Taiwan patent application No. 98122272.

(Continued)

*Primary Examiner* — David Nhu
(74) *Attorney, Agent, or Firm* — Patterson & Sheridan, LLP

(57) ABSTRACT

A capping layer may be deposited over the active channel of a thin film transistor (TFT) in order to protect the active channel from contamination. The capping layer may affect the performance of the TFT. If the capping layer contains too much hydrogen, nitrogen, or oxygen, the threshold voltage, sub threshold slope, and mobility of the TFT may be negatively impacted. By controlling the ratio of the flow rates of the nitrogen, oxygen, and hydrogen containing gases, the performance of the TFT may be optimized. Additionally, the power density, capping layer deposition pressure, and the temperature may also be controlled to optimize the TFT performance.

17 Claims, 8 Drawing Sheets

(56) References Cited

U.S. PATENT DOCUMENTS

| | | | |
|---|---|---|---|
| 4,759,993 A | 7/1988 | Pai et al. | |
| 4,769,291 A | 9/1988 | Belkind et al. | |
| 4,816,082 A | 3/1989 | Guha et al. | |
| 4,983,360 A | 1/1991 | Merdrignac et al. | |
| 5,279,679 A | 1/1994 | Murakami et al. | |
| 5,346,601 A | 9/1994 | Barada et al. | |
| 5,352,300 A | 10/1994 | Niwa et al. | |
| 5,420,452 A | 5/1995 | Tran et al. | |
| 5,522,934 A | 6/1996 | Suzuki et al. | |
| 5,571,749 A | 11/1996 | Matsuda et al. | |
| 5,620,523 A | 4/1997 | Maeda et al. | |
| 5,668,663 A | 9/1997 | Varaprasad et al. | |
| 5,683,537 A | 11/1997 | Ishii | |
| 5,700,699 A | 12/1997 | Han et al. | |
| 5,716,480 A | 2/1998 | Matsuyama et al. | |
| 5,720,826 A | 2/1998 | Hayashi et al. | |
| 5,731,856 A | 3/1998 | Kim et al. | |
| 5,993,594 A | 11/1999 | Wicker et al. | |
| 6,150,668 A | 11/2000 | Bao et al. | |
| 6,153,013 A | 11/2000 | Sakai et al. | |
| 6,153,893 A | 11/2000 | Inoue et al. | |
| 6,159,763 A | 12/2000 | Sakai et al. | |
| 6,180,870 B1 | 1/2001 | Sano et al. | |
| 6,228,236 B1 | 5/2001 | Rosenstein et al. | |
| 6,238,527 B1 | 5/2001 | Sone et al. | |
| 6,329,269 B1 | 12/2001 | Hamada et al. | |
| 6,388,301 B1 | 5/2002 | Tawada et al. | |
| 6,458,673 B1 | 10/2002 | Cheung | |
| 6,488,824 B1 | 12/2002 | Hollars et al. | |
| 6,566,180 B2 | 5/2003 | Park et al. | |
| 6,620,719 B1 | 9/2003 | Andry et al. | |
| 6,700,057 B2 | 3/2004 | Yasuno | |
| 6,787,010 B2 | 9/2004 | Cuomo et al. | |
| 6,825,134 B2 | 11/2004 | Law et al. | |
| 6,881,305 B2 | 4/2005 | Black et al. | |
| 6,890,803 B2 | 5/2005 | Lin et al. | |
| 6,943,359 B2 | 9/2005 | Vardeny et al. | |
| 6,953,947 B2 | 10/2005 | Son et al. | |
| 7,026,713 B2 | 4/2006 | Hoffman et al. | |
| 7,037,157 B2 | 5/2006 | Murakami et al. | |
| 7,145,174 B2 | 12/2006 | Chiang et al. | |
| 7,158,208 B2 | 1/2007 | De Jager et al. | |
| 7,189,992 B2 | 3/2007 | Wager, III et al. | |
| 7,235,810 B1 | 6/2007 | Yamazaki et al. | |
| 7,297,977 B2 | 11/2007 | Hoffman et al. | |
| 7,309,895 B2 | 12/2007 | Hoffman et al. | |
| 7,339,187 B2 | 3/2008 | Wager, III et al. | |
| 7,378,286 B2 | 5/2008 | Hsu et al. | |
| 7,382,421 B2 | 6/2008 | Hoffman et al. | |
| 7,601,984 B2 | 10/2009 | Sano et al. | |
| 7,626,201 B2 | 12/2009 | Chiang et al. | |
| 7,629,191 B2 | 12/2009 | Chiang et al. | |
| 7,674,650 B2 | 3/2010 | Akimoto et al. | |
| 7,750,440 B2 | 7/2010 | Yagi | |
| 8,012,794 B2 * | 9/2011 | Ye | 438/104 |
| 8,435,843 B2 * | 5/2013 | Ye | 438/158 |
| 2002/0117719 A1 | 8/2002 | Ando et al. | |
| 2002/0149053 A1 | 10/2002 | Tsunoda et al. | |
| 2003/0015234 A1 | 1/2003 | Yasuno | |
| 2003/0049464 A1 | 3/2003 | Glenn et al. | |
| 2003/0207093 A1 | 11/2003 | Tsuji et al. | |
| 2004/0007748 A1 | 1/2004 | Sakama et al. | |
| 2004/0018797 A1 | 1/2004 | Murakami et al. | |
| 2004/0038446 A1 | 2/2004 | Takeda et al. | |
| 2004/0092061 A1 | 5/2004 | Kawasaki et al. | |
| 2004/0113098 A1 | 6/2004 | Vardeny et al. | |
| 2004/0164294 A1 | 8/2004 | Son et al. | |
| 2004/0175511 A1 | 9/2004 | Hartig | |
| 2004/0235224 A1 | 11/2004 | Lin et al. | |
| 2005/0017244 A1 | 1/2005 | Hoffman et al. | |
| 2005/0028860 A1 | 2/2005 | Sano et al. | |
| 2005/0062057 A1 | 3/2005 | Yamazaki et al. | |
| 2005/0062409 A1 | 3/2005 | Yamazaki et al. |
| 2005/0067953 A1 | 3/2005 | Yamazaki et al. |
| 2005/0181532 A1 | 8/2005 | Patel et al. |
| 2005/0233092 A1 | 10/2005 | Choi et al. |
| 2005/0233595 A1 | 10/2005 | Choi et al. |
| 2005/0251990 A1 | 11/2005 | Choi et al. |
| 2006/0011139 A1 | 1/2006 | Sterling et al. |
| 2006/0033106 A1 | 2/2006 | Seo et al. |
| 2006/0038182 A1 | 2/2006 | Rogers et al. |
| 2006/0043447 A1 | 3/2006 | Ishii et al. |
| 2006/0046476 A1 | 3/2006 | Nakamura et al. |
| 2006/0065299 A1 | 3/2006 | Fukawa et al. |
| 2006/0108636 A1 | 5/2006 | Sano et al. |
| 2006/0125098 A1 | 6/2006 | Hoffman et al. |
| 2006/0258064 A1 | 11/2006 | Chen et al. |
| 2006/0286725 A1 | 12/2006 | Cheng et al. |
| 2007/0007125 A1 | 1/2007 | Krasnov et al. |
| 2007/0026321 A1 | 2/2007 | Kumar |
| 2007/0029626 A1 | 2/2007 | Sakama et al. |
| 2007/0030569 A1 | 2/2007 | Lu et al. |
| 2007/0057261 A1 | 3/2007 | Jeong et al. |
| 2007/0065962 A1 | 3/2007 | Pichler |
| 2007/0068571 A1 | 3/2007 | Li et al. |
| 2007/0072439 A1 | 3/2007 | Akimoto et al. |
| 2007/0093013 A1 | 4/2007 | Chua et al. |
| 2007/0141784 A1 | 6/2007 | Wager et al. |
| 2007/0194379 A1 | 8/2007 | Hosono et al. |
| 2007/0252129 A1 | 11/2007 | Yagi |
| 2007/0252147 A1 | 11/2007 | Kim et al. |
| 2007/0252152 A1 | 11/2007 | Sato et al. |
| 2008/0038882 A1 | 2/2008 | Takechi et al. |
| 2008/0108198 A1 | 5/2008 | Wager et al. |
| 2008/0132009 A1 | 6/2008 | Hirai |
| 2008/0173870 A1 | 7/2008 | Kim et al. |
| 2008/0224133 A1 | 9/2008 | Park et al. |
| 2008/0264777 A1 | 10/2008 | Ye |
| 2008/0272388 A1 | 11/2008 | Ushiyama et al. |
| 2008/0308411 A1 | 12/2008 | Guo et al. |
| 2009/0026065 A1 | 1/2009 | Nukeaw et al. |
| 2009/0045398 A1 | 2/2009 | Kato et al. |
| 2009/0212287 A1 | 8/2009 | Nathan et al. |
| 2009/0233424 A1 | 9/2009 | Ye |
| 2009/0239335 A1 | 9/2009 | Akimoto et al. |
| 2009/0305461 A1 | 12/2009 | Akimoto et al. |
| 2010/0078633 A1 | 4/2010 | Watanabe |
| 2010/0090215 A1 | 4/2010 | Lee |
| 2010/0109002 A1 | 5/2010 | Itagaki et al. |
| 2010/0117073 A1 | 5/2010 | Yamazaki et al. |
| 2010/0120197 A1 | 5/2010 | Levy et al. |
| 2010/0140611 A1 | 6/2010 | Itagaki et al. |
| 2010/0193783 A1 | 8/2010 | Yamazaki et al. |
| 2010/0252832 A1 | 10/2010 | Asano et al. |

FOREIGN PATENT DOCUMENTS

| | | |
|---|---|---|
| CN | 1881549 A | 12/2006 |
| EP | 145403 A2 | 6/1985 |
| JP | 61-291976 | 12/1986 |
| JP | 02-240637 A | 9/1990 |
| JP | 05-009739 | 1/1993 |
| JP | 06-045354 A | 2/1994 |
| JP | 2001-135824 A | 5/2001 |
| JP | 3255942 B2 | 2/2002 |
| JP | 2003-273134 | 9/2003 |
| JP | 2006-165529 | 6/2006 |
| JP | 2007-073560 A | 3/2007 |
| JP | 2007-073704 | 3/2007 |
| JP | 2007-123861 | 5/2007 |
| JP | 3958605 | 5/2007 |
| JP | 2008-042088 | 2/2008 |
| JP | 2008-060419 A | 3/2008 |
| KR | 1999009046 | 3/1999 |
| KR | 2001-0011855 A | 2/2001 |
| KR | 2001051193 | 6/2001 |
| KR | 10-0590925 B1 | 6/2006 |
| TW | 200424727 | 11/2004 |

(56) References Cited

FOREIGN PATENT DOCUMENTS

TW          200618295          6/2006
WO     WO-2008/133345 A1     11/2008

OTHER PUBLICATIONS

Office Action for Chinese Patent Application No. 200980125524.0 dated Jul. 4, 2012.
Office Action for Chinese Patent Application No. 200980125888.9 dated Jul. 27, 2012.
Search Report and Written Opinion for PCT/US2009/049084 dated Jan. 25, 2010.
Freeman et al., "Chemical and Thin-Film Strategies for New Transparent Conducting Oxides", Mrs Bulletin, Aug. 2000, p. 45-51.
Jin et al., "Optical properties of transparent and heat reflecting ZnO:Al films made by reactive sputtering", Appl. Phys. Lett. 51 (3), Jul. 20, 1987, p. 149-151.
Pei et al., "Optical and electrical properties of direct-current magnetron sputtered ZnO:Al films", Journal of Applied Physics, vol. 90, No. 7, Oct. 1, 2001, p. 3432-3436.
Gordon, "Criteria for Choosing Transparent Conductors", MRS Bulletin, Aug. 2000, p. 52-57.
European search report dated Jun. 30, 2010 for European Patent Application 08797025.7.
Barnes et al., "A comparison of plasma-activated N2/O2 and N2)/O2 mixtures for use in ZnO:N synthesis by chemical vapor deposition", Journal of Applied Physics, vol. 96, No. 12 (Dec. 2004).
Cao et al., "Low resistivity p-ZnO films fabricated by sol-gel spin coating", Applied Physics Letters, 88, 251116 (Jun. 2006).
Zhao et al., "Growth of nitrogen-doped p-type ZnO films by spray pyrolysis and their electrical and optical properties", Journal of Crystal Growth, 280 (May 2005), pp. 495-501.
Barnes et al., "A comparison of plasma-activated N2/O2 and N2O/O2 mixtures for use in ZnO:N synthesis by chemical vapor deposition", Journal of Applied Physics, vol. 96, No. 12 (Dec. 2004).
Zhao et al., "Growth of nitrogen-doped p-type ZnO films by spray pyrolysis and their electrical and optical properties", Journal of Crystal Growth, 280 (May 2005), 495-501.
Ye et al., "High mobility amorphous zinc oxynitride semiconductor material for thin film transistors", Journal of Applied Physics, 106, 074512 (2009).
Chiang et al., "High mobility transparent thin-film transistors with amorphous zinc tin oxide channel layer", Appl. Phys. Lett., 86, 013503 (2005).
Fortunato et al., "Wide-bandgap high-mobility ZnO thin-film transistors produced at room temperature", Applied Physics Letters, vol. 85, No. 13, 2541-2543.
Jackson et al., "High-performance flexible zinc tin oxide field-effect transistors", Applied Physics Letters, 87, 193503 (2005).
Zong et al., "Optical band gap of zinc nitride films prepared on quartz substrates from a zinc nitride target by reactive rf magnetron sputtering", Applied Surface Science 252 (2006), pp. 7983-7986.
Tu et al., "Nitrogen-doped p-type ZnO films prepared from nitrogen gas radio-frequency magnetron sputtering", Journal of Applied Physics 100, 053705 (2006).
Futushara et al., "Optical properties of zinc oxynitride thin films", Thin Film Solids, 317 (1998), pp. 322-325.
Ozgur, et al. "A comprehensive review of ZnO materials and devices," Journal of Applied Physics 98, 041301 (2005), American Institute of Physics.
Wang, et al. "Epitaxial growth of NH3-doped ZnO thin films on <0224> oriented sapphire substrates," Journal of Crystal Growth 255, Apr. 9, 2003, pp. 293-297.
Ye, et al. "Preparation and characteristics of p-type ZnO films by DC reactive magnetron sputtering," Journal of Crystal Growth 253, Feb. 4, 2003, pp. 258-264.
Korean Office Action dated Jul. 21, 2008 for Korean Application No. 10-2007-0066962.

Hiramatsu, et al. "Formation of TiN films with low Cl concentration by pulsed plasma chemical vapor deposition," American Vacuum Society, vol. 14, No. 3, May/Jun. 1996, pp. 1037-1040.
Son et al., "Threshold Voltage Control of Amorphous Gallium Indium Zinc Oxide TFTs by Suppressing Back-Channel Current" Electrochemical and Solid-State Letters, 12 (1) H26-H28 (2009).
Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.
Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018-$1.00+.00, 2006, pp. 18-20.
Li et al. "Progress in semiconducting oxide-based thin-film transistors for displays," Institute of Physics, Semicon. Sci. Technol. 20 (2005), pp. 720-725.
Masuda et al. "Transparent thin film transistors using ZnO as an active channel layer and their electrical properties," Journal of Applied Physics, vol. 93, No. 3, Feb. 1, 2003, American Institute of Physics, pp. 1624-1630.
International Search Report and Written Opinion dated Aug. 8, 2008 for International Application No. PCT/US08/59638.
International Search Report and Written Opinion dated Oct. 8, 2008 for International Application No. PCT/US08/71890.
International Search Report and Written Opinion dated Oct. 15, 2007 for International Application No. PCT/US07/66166.
Toyoura et al., "Optical properties of zinc nitride formed by molten salt electrochemical process", Thin Film Solids 492 (2005), pp. 88-92.
Ma et al., "Method of control of nitrogen content in ZnO films: Structural and photoluminescence properties", J. Vac. Sci. Technol. B 22(1), Jan./Feb. 2004, pp. 94-98.
Fortunato et al., "Wide-bandgap high-mobility ZnO thin-film transistors produced at room temperature", Applied Physics Letters, vol. 85, No. 13, Sep. 27, 2004, pp. 2541-2543.
Hoffman et al., "ZnO-based transparent thin-film transistors", Applied Physics Letters, vol. 82, No. 5, Feb. 3, 2003, pp. 733-735.
Bain et al., "Deposition and electrical properties of N-In codoped p-type ZnO films by ultrasonic spray pyrolysis", Applied Physics Letters, vol. 84, No. 4, Jan. 26, 2004, pp. 541-543.
Barnes et al., "On the formation and stability of p-type conductivity in nitrogen-doped zinc oxide", Applied Physics Letters, 86, 112112 (2005).
Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.
Hosano et al., "Working hypothesis to explore novel wide band gap electrically conducting amorphous oxides and examples", Journal of Non-Crystalline Solids, 198-200 (1996) pp. 165-169.
Park et al., "Highly Stable $Ga_2O_3$-$In_2O_3$-ZnO Thin-Film Transistors for AM-OLED Application", IDW '07, pp. 1775-1778.
Kwon et al., "4 inch QVGA AMOLED display driven by GaInZnO TFT", IDW '07, pp. 1783-1786.
Perkins et al., "Identification of nitrogen chemical states in N-doped ZnO via x-ray photoelectron spectroscopy", Journal of Applied Physics 97, 034907 (2005).
Yao et al., "Effects of nitrogen doping and illumination on lattice constants and conductivity behavior of zinc oxide grown by magnetron sputtering", Journal of Applied Physics 99, 123510 (2006).
Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.
Lee et al., "42.2: World's Largest (15-inch) XGA AMLCD Panel Using IGZO Oxide TFT", SID 08 Digest, pp. 625-628.
Zong et al., "Structural properties of zinc nitride empty balls", Materials Letters 60 (2006), pp. 905-908.
Nomura et al., "Room-temperature fabrication of transparent flexible thin-film transistors using amorphous oxide semiconductors", Nature, vol. 432, Nov. 25, 2004, pp. 788-492.

(56) References Cited

OTHER PUBLICATIONS

Minami, Tadatsugu, "New n-Type Transparent Conducting Oxides", MRS Bulletin, Aug. 2000.
Zong et al., "Synthesis and thermal stability of $Zn_3N_2$ powder", Solid State Communications 132 (2004), pp. 521-525.
Kaminska et al., "Transparent p-type ZnO films obtained by oxidation of sputter-deposited $Zn_3N_2$", Solid State Communications, 135 (2005), pp. 11-15.
Son et al., "42.4L: Late-News Paper: 4 inch QVGA AMOLED Driven by the Threshold Voltage Controlled Amorphous GIZO ($Ga_2O_3$-$In_2O_3$-ZnO) TFT", SID 08 Digest, pp. 633-636.
Futushara et al., "Structural, electrical and optical properties of zinc nitride thin films prepared by reactive rf magnetron sputtering", Thin Film Solids, 322 (1998), pp. 274-281.
Carcia et al., "Transparent ZnO thin-film transistor fabricated by rf magnetron sputtering", Applied Physics Letters, col. 82, No. 7, Feb. 17, 2003, pp. 1117-1119.
Yan et al., "Control of Doping by Impurity Chemical Potentials: Predictions for p-type ZnO", Physical Review Letters, vol. 86, No. 25, Jun. 18, 2001, pp. 5723-5726.
Ohya et al., "Thin Film Transistor of ZnO Fabricated by Chemical Solution Deposition", Jpn. J. Appl. Phys., vol. 40 (2001), pp. 297-298.
Hossain, et al., "Modeling and simulation of polycrystalline ZnO thin-film transistors", Journal of Applied Physics, vol. 94, No. 12, Dec. 15, 2003, pp. 7768-7777.
Park et al., "Challenge to Future Displays: Transparent AM-OLED driven by PEALD grown ZnO TFT", IMID '07 Digest, pp. 1249-1252.
Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.
First Office Action for Chinese Patent Application No. 200880015621.X dated Nov. 24, 2010.
Wang et al., "Fabrication and characteristics of the low-resistive p-type ZnO thin films by DC reactive magnetron sputtering", Materials Letters, vol. 60, p. 912-914, Dec. 31, 2006.
Wang, "The optical and electrical characteristics and the microstructure of Al doped zinc oxide thin films", Dept. of Information material science and engineering Guilin, vol. 25(02), p. 19-22, Apr. 20, 2005.
Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.
Search report and written opinion for PCT/US2009/047966 dated Dec. 27, 2010.
Search report and written opinion for PCT/US2009/049092 dated Dec. 27, 2010.
Lu et al., "p-type conduction in N-Al co-doped ZnO thin films", Applied Physics Letters, vol. 85, No. 15, Oct. 2004, p. 3134-3135.
Zhuge et al., "ZnO p-n homojunctions and ohmic contacts to Al-N-co-doped p-type ZnO", Applied Physics Letters, vol. 87, Aug. 2005.
dit Picard et al., "Detection of NH3 and H2S with thick film semiconductor sensors based on $Cd_{2-x}GeO_{4-x-3y}N_{2y}$ oxynitrides", Sensors and Actuators B, vol. 42, 1997, pp. 47-51.
Office Action for Chinese Patent Application No. 200880106291.5 dated Mar. 30, 2011.
International Search Report and Written Opinion for PCT/US2010/049239 dated May 4, 2011.
JP Office Action dated Oct. 18, 2013 for Application No. 2011-516775.
JP Office Action dated Oct. 18, 2013 for Application No. 2011-516778.
JP Office Action dated Nov. 13, 2013 for Application No. 2011-516475.
Office Action dated Mar. 13, 2013 for Chinese Patent Application No. 200980125888.9.

\* cited by examiner

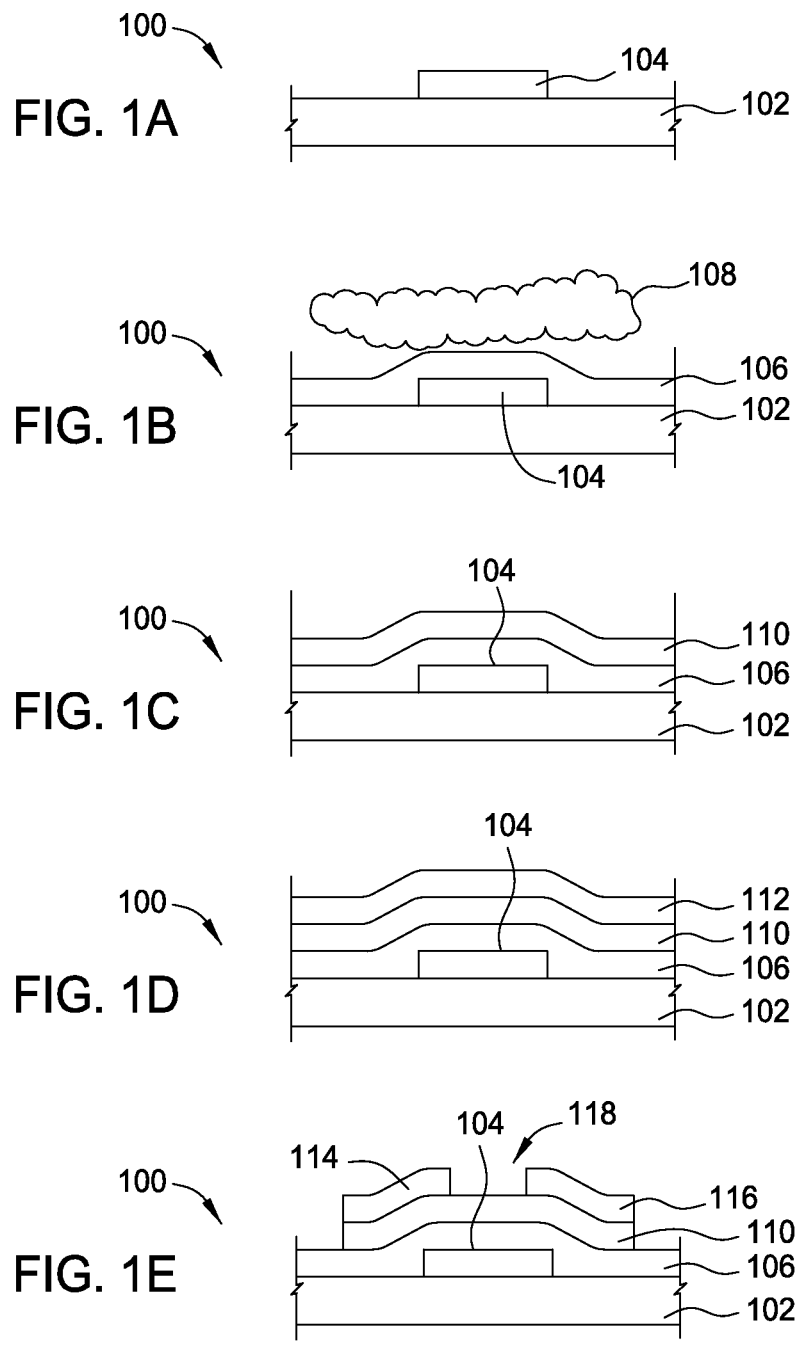

CAPPING LAYERS FOR METAL OXYNITRIDE TFTS

CROSS-REFERENCE TO RELATED APPLICATIONS

This application is a continuation of U.S. patent application Ser. No. 12/493,718 (APPM/13582.03), filed Jun. 29, 2009, now U.S. Pat. No. 8,012,794 B2 which claims benefit of U.S. Provisional Patent Application Ser. No. 61/077,831 (APPM/013582L), filed Jul. 2, 2008, U.S. Provisional Patent Application Ser. No. 61/117,744 (APPM/013582L02), filed Nov. 25, 2008 and U.S. Provisional Patent Application Ser. No. 61/117,747 (APPM/013582L03), filed Nov. 25, 2008, all of which are herein incorporated by reference.

GOVERNMENT RIGHTS IN THIS INVENTION

This invention was made with Government support under Agreement No. DAAD19-02-3-0001 awarded by ARL. The Government has certain rights in the Invention.

BACKGROUND OF THE INVENTION

1. Field of the Invention

Embodiments of the present invention generally relate to a method of fabricating thin film transistors (TFTs).

2. Description of the Related Art

Current interest in TFT arrays is particularly high because these devices may be used in liquid crystal active matrix displays (LCDs) of the kind often employed for computer and television flat panels. The LCDs may also contain light emitting diodes (LEDs) for back lighting. Further, organic light emitting diodes (OLEDs) have been used for active matrix displays, and these OLEDs require TFTs for addressing the activity of the displays.

TFTs made with amorphous silicon have become the key components of the flat panel display industry. Unfortunately amorphous silicon does have its limitations such as low mobility. The mobility required for OLEDs is at least 10 times higher than that achievable with amorphous silicon. In addition, OLED display is more sensitive to the $V_{th}$ shift since it is a current driven device. $V_{th}$ shift of amorphous TFTs under either high current or high bias voltage is an issue to be addressed. Polysilicon, on the other hand, has a higher mobility than amorphous silicon. Polysilicon is crystalline, which leads to poor local non-uniformity. Due to the requirement of a complex annealing process to make the polysilicon film, it is more difficult and/or more costly to make large area displays using polysilicon. Due to the limitations of amorphous silicon, OLED advancement has been difficult.

In recent years, transparent TFTs have been created in which zinc oxide has been used as the active channel layer. Zinc oxide is a compound semiconductor that can be grown as a crystalline material at relatively low deposition temperatures on various substrates such as glass and plastic. Zinc oxide based semiconductors can be made as amorphous material through doping. Therefore, doped zinc oxide will avoid the non-uniformity issues that may result from a non-uniform grain structure. Amorphous semiconductors such as zinc oxide are more easily implemented in current display manufacturing processes using bottom gate TFT structures.

Therefore, there is a need in the art for TFTs having transparent active channels with high mobility.

SUMMARY OF THE INVENTION

A capping layer may be deposited over the active channel of a TFT in order to protect the active channel from contamination. The capping layer may affect the performance of the TFT. If the capping layer contains too much hydrogen, nitrogen, or oxygen, the threshold voltage, sub threshold slope, and mobility of the TFT may be negatively impacted. By controlling the ratio of the flow rates of the nitrogen, oxygen, and hydrogen containing gases, the performance of the TFT may be optimized. Additionally, the power density, capping layer deposition pressure, and the temperature may also be controlled to optimize the TFT performance.

In one embodiment of the invention, a thin film transistor fabrication method is disclosed. The method comprises depositing a semiconductor layer over a thin film transistor stack comprising a substrate, a gate electrode, and a gate dielectric layer, depositing a conductive layer over the semiconductor layer, etching the conductive layer and the semiconductor layer, and depositing a capping layer over the exposed semiconductor layer. The semiconductor layer comprises nitrogen, oxygen, and one or more elements selected from zinc, indium, tin, gallium, cadmium, and combinations thereof. In one embodiment, the semiconductor layer comprises oxygen and one or more elements selected from zinc, indium, gallium, cadmium, and combinations thereof. The etching defines the TFT active area and source and drain electrodes and exposes a portion of the semiconductor layer between the source and drain electrodes defined as the active channel. The depositing of the capping layer comprises flowing $N_2O$ and $SiH_4$ gas into a processing chamber at a ratio of $N_2O$ and $SiH_4$ of between about 20:1 to about 40:1.

In another embodiment, a thin film transistor fabrication method is disclosed. The method comprises depositing a semiconductor layer over a thin film transistor stack comprising a substrate, a gate electrode, and a gate dielectric layer, depositing a capping layer over the semiconductor layer, etching the capping layer and making the capping layer covering the TFT active area, depositing a conductive layer and defining the source and drain electrodes and active channel area. The semiconductor layer comprises nitrogen, oxygen, and one or more elements selected from zinc, indium, tin, gallium, cadmium, and combinations thereof. In one embodiment, the semiconductor layer comprises oxygen and one or more elements selected from zinc, indium, tin, gallium, cadmium, and combinations thereof. The capping layer may also be referred to as an etch stop layer. The etching of the capping layer defines the active area of the TFT and etching of the conductive layer defines source and drain electrodes. The depositing the capping layer comprises flowing $N_2O$, $SiH_4$, and $PH_3$ gas into a processing chamber and controlling a power density to a gas distribution showerhead in the processing chamber. The pressure may be between about 500 mTorr to about 2.5 Torr. The power density may be between about $1.16\times10^{-6}$ W/cm$^2$ to about $4.63\times10^{-3}$ W/cm$^2$.

In another embodiment, a thin film transistor comprises one or more gate dielectric layers disposed over a gate electrode and a substrate, a semiconductor layer disposed over the one or more gate dielectric layers and source and drain electrodes, a first capping layer disposed over the semiconductor layer and etched with a pattern to define the active channel, and a second capping layer disposed over the first capping layer and other areas. The semiconductor layer comprises nitrogen, oxygen, and one or more elements selected from zinc, indium, gallium, cadmium, tin, and combinations thereof. In one embodiment, the semiconductor layer comprises oxygen and one or more elements selected from zinc, indium, tin, gallium, cadmium, and combinations thereof. The source and drain electrodes are spaced apart a first distance and expose a portion of the semiconductor layer defined as an active channel.

The capping layer may be a single layer or multiple layers with a combination of silicon oxide, silicon nitride, silicon oxynitride, silicon carbide, amorphous carbon, other dielectric films, or combinations thereof. The capping layer or layers may be deposited within a single processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1G are schematic cross sectional views of a TFT 100 according to one embodiment of the invention at various stages of fabrication.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1F:
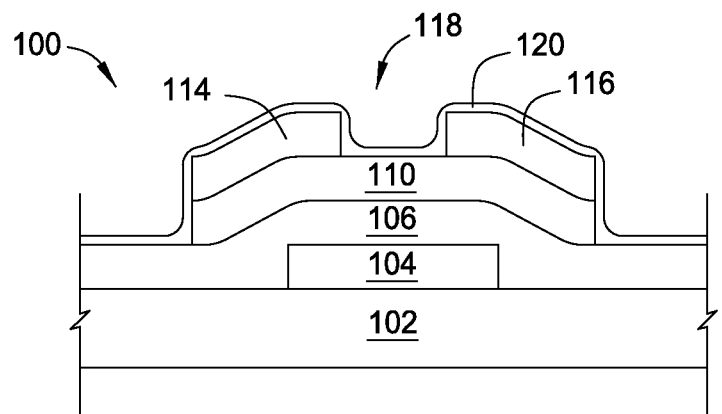
Figure 1G:
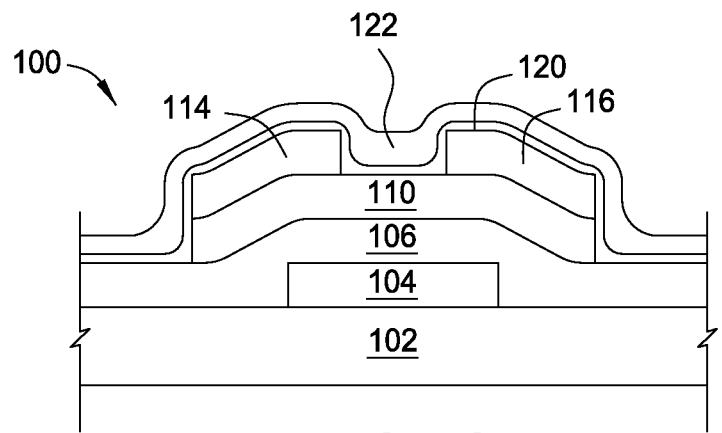

A capping layer may be deposited over the active channel of a TFT in order to protect the active channel from contamination. The capping layer may affect the performance of the TFT. If the capping layer contains too much hydrogen, nitrogen, or oxygen, the threshold voltage, sub threshold slope, and mobility of the TFT may be negatively impacted. By controlling the ratio of the flow rates of the nitrogen, oxygen, and hydrogen containing gases, the performance of the TFT may be optimized. Additionally, the power density, capping layer deposition pressure, and the temperature may also be controlled to optimize the TFT performance.

FIGS. 1A-1G are schematic cross sectional views of a TFT 100 according to one embodiment of the invention at various stages of fabrication. The TFT may comprise a substrate 102. In one embodiment, the substrate 102 may comprise glass. In another embodiment, the substrate 102 may comprise a polymer. In another embodiment, the substrate 102 may comprise plastic. In still another embodiment, the substrate 102 may comprise metal.

Over the substrate, a gate electrode 104 may be formed. The gate electrode 104 may comprise an electrically conductive layer that controls the movement of charge carriers within the TFT. The gate electrode 104 may comprise a metal such as aluminum, tungsten, chromium, tantalum, or combinations thereof. The gate electrode 104 may be formed using conventional deposition techniques including sputtering, lithography, and etching. The gate electrode 104 may be formed by blanket depositing a conductive layer over the substrate 102. The conductive layer may be deposited by sputtering. Thereafter, a photoresist layer may be deposited over the conductive layer. The photoresist layer may be patterned to form a mask. The gate electrode 104 may be formed by etching away the unmasked portions of the conductive layer to leave the gate electrode 104 on the substrate 102.

Over the gate electrode 104, a gate dielectric layer 106 may be deposited. The gate dielectric layer 106 affects the sub threshold swing or slope and the threshold voltage of the TFT. For silicon based TFTs TFTs having a silicon based semiconductor layer such as amorphous silicon), the gate dielectric layer 106 cannot comprise silicon oxide because $V_{th}$ is far away from zero volts of the gate voltage which may the TFT perform poorly. However, for metal oxide TFTs, it has been discovered that silicon oxide may function as an effective gate dielectric layer 106. The oxygen in the silicon oxide may not detrimentally alter the metal oxide layer and thus, the TFT may not fail. In one embodiment, the gate dielectric layer 106 may comprise silicon nitride. In another embodiment, the gate dielectric layer 106 may comprise silicon oxide. In another embodiment, the gate dielectric layer 106 may comprise silicon oxynitride. In another embodiment, the gate dielectric layer 106 may comprise $Al_2O_3$. The gate dielectric layer 106 may be deposited by well known deposition techniques including plasma enhanced chemical vapor deposition (PECVD). In one embodiment, the gate dielectric layer 106 may be deposited by physical vapor deposition (PVD).

After the gate dielectric layer 106 has been deposited, the gate dielectric layer 106 may be treated. One of the techniques involves exposing the gate dielectric layer 106 to a plasma 108 to passivate the surface of the gate dielectric layer 106. In one embodiment, the gate dielectric layer 106 may be exposed to a plasma comprising an oxygen containing gas such as $N_2O$ or $O_2$. In another embodiment, the gate dielectric layer 106 may be exposed to a plasma comprising $H_2$, Ar, $N_2$, or $PH_3$ after exposure to the oxygen containing plasma. In another embodiment, the gate dielectric layer 106 may be exposed to an oxygen containing gas in the absence of plasma such as $N_2O$ or $O_2$. In another embodiment, the gate dielectric layer 106 may be exposed to an oxygen containing plasma after exposure to an oxygen containing gas. In still another embodiment, a silicon oxide layer may be deposited over the gate dielectric layer 106 in addition to or instead of treating the gate dielectric layer 106.

After treating the gate dielectric layer 106, the semiconductor layer 110 may be deposited thereover. The semiconductor layer 110 will be the material that comprises the active channel in the final TFT structure. The semiconductor layer 110 may comprise oxygen, nitrogen, and one or more elements selected from the group consisting of zinc, gallium, cadmium, indium, tin, and combinations thereof. In one embodiment, the semiconductor layer 110 may comprise oxygen, nitrogen, and one or more elements having a filled s orbital and a filled d orbital. In another embodiment, the semiconductor layer 110 may comprise oxygen, nitrogen, and one or more elements having a filled f orbital. In another embodiment, the semiconductor layer 110 may comprise oxygen, nitrogen, and one or more divalent elements. In another embodiment, the semiconductor layer 110 may comprise oxygen, nitrogen, and one or more trivalent elements. In another embodiment, the semiconductor layer may comprise oxygen, nitrogen, and one or more tetravalent elements.

The semiconductor layer 110 may also comprise a dopant. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In another embodiment, the dopant comprises tin.

Examples of semiconductor layer 110 include the following: $ZnO_xN_y$, $SnO_xN_y$, $InO_xN_y$, $CdO_xN_y$, $GaO_xN_y$, $ZnSnO_xN_y$, $ZnInO_xN_y$, $ZnCdO_xN_y$, $ZnGaO_xN_y$, $SnInO_xN_y$, $SnCdO_xN_y$, $SnGaO_xN_y$, $InCdO_xN_y$, $InGaO_xN_y$, $CdGaO_xN_y$, $ZnSnInO_xN_y$, $ZnSnCdO_xN_y$, $ZnSnGaO_xN_y$, $ZnInCdO_xN_y$, $ZnInGaO_xN_y$, $ZnCdGaO_xN_y$, $SnInCdO_xN_y$, $SnInGaO_xN_y$, $SnCdGaO_xN_y$, $InCdGaO_xN_y$, $ZnSnInCdO_xN_y$, $ZnSnInGaO_xN_y$, $ZnInCdGaO_xN_y$, and $SnInCdGaO_xN_y$. Examples of semiconductor layer 110 include the following doped materials: $ZnO_xN_y$:Al, $ZnO_xN_y$:Sn, $SnO_xN_y$:Al, $InO_xN_y$:Al, $InO_xN_y$:Sn, $CdO_xN_y$:Al, $CdO_xN_y$:Sn, $GaO_xN_y$:Al, $GaO_xN_y$:Sn, $ZnSnO_xN_y$:Al, $ZnInO_xN_y$:Al, $ZnInO_xN_y$:Sn, $ZnCdO_xN_y$:Al, $ZnCdO_xN_y$:Sn, $ZnGaO_xN_y$:Al, $ZnGaO_xN_y$:Sn, $SnInO_xN_y$:Al, $SnCdO_xN_y$:Al, $SnGaO_xN_y$:Al, $InCdO_xN_y$:Al, $InCdO_xN_y$:Sn, $InGaO_xN_y$:Al, $InGaO_xN_y$:Sn, $CdGaO_xN_y$:Al, $CdGaO_xN_y$:Sn, $ZnSnInO_xN_y$:Al, $ZnSnCdO_xN_y$:Al, $ZnSnGaO_xN_y$:Al, $ZnInCdO_xN_y$:Al, $Zn InCdO_xN_y$:Sn, $ZnInGaO_xN_y$:Al, $ZnInGaO_xN_y$:Sn, $ZnCdGaO_xN_y$:Al, $ZnCdGaO_xN_y$:Sn, $SnInCdO_xN_y$:Al, $SnInGaO_xN_y$:Al, $SnCdGaO_xN_y$:Al, $InCdGaO_xN_y$:Al, $InCdGaO_xN_y$:Sn, $ZnSnInCdO_xN_y$:Al, $ZnSnInGaO_xN_y$:Al, $ZnInCdGaO_xN_y$:Al, $ZnInCdGaO_xN_y$:Sn, and $SnInCdGaO_xN_y$:Al.

The semiconductor layer 110 may be deposited by sputtering. In one embodiment, the sputtering target comprises the metal such as zinc, gallium, tin, cadmium, indium, or combinations thereof. The sputtering target may additionally comprise a dopant. Oxygen containing gas and nitrogen containing gas are introduced into the chamber to deposit the semiconductor layer 110 by reactive sputtering. In one embodiment, the nitrogen containing gas comprises $N_2$. In another embodiment, the nitrogen containing gas comprises $N_2O$, $NH_3$, or combinations thereof. In one embodiment, the oxygen containing gas comprises $O_2$. In another embodiment, the oxygen containing gas comprises $N_2O$. The nitrogen of the nitrogen containing gas and the oxygen of the oxygen containing gas react with the metal from the sputtering target to form a semiconductor material comprising metal, oxygen, nitrogen, and optionally a dopant on the substrate. In one embodiment, the nitrogen containing gas and the oxygen containing gas are separate gases. In another embodiment, the nitrogen containing gas and the oxygen containing gas comprise the same gas. Additional additives such as $B_2H_6$, $CO_2$, CO, $CH_4$, and combinations thereof may also be provided to the chamber during the sputtering.

After the semiconductor layer 110 has been deposited, a conductive layer 112 may be deposited. In one embodiment, the conductive layer 112 may comprise a metal such as aluminum, tungsten, molybdenum, chromium, tantalum, and combinations thereof. The conductive layer 112 may be deposited by using PVD.

After the conductive layer 112 is deposited, the source electrode 114, the drain electrode 116, and the active channel 118 may be defined by etching away portions of the conductive layer 112. Portions of the semiconductor layer 110 may also be removed by etching. Although not shown, a capping layer (or etch stop layer) may be deposited over the semiconductor layer 110 prior to depositing the conductive layer. The etch stop layer functions to protect the active channel 118 from undue plasma exposure during etching.

Over the semiconductor layer 110 and within the active channel 118, a first capping layer 120 may be deposited. In one embodiment, the first capping layer 120 may comprise silicon oxide. In another embodiment, the first capping layer 120 may comprise silicon oxynitride. In one embodiment, the first capping layer 120 may be deposited by PECVD. In another embodiment, the first capping layer 120 may be deposited by CVD. In another embodiment, the first capping layer 120 may comprise silicon carbide. In another embodiment, the first capping layer 120 may comprise amorphous carbon.

In order to deposit the first capping layer 120, a silicon containing gas may be introduced into the processing chamber. In one embodiment, the silicon containing gas may comprise $SiH_4$. In another embodiment, the silicon containing gas may comprise TEOS. In addition to the silicon containing gas, $N_2O$, NO, $NO_2$, $O_2$, CO, $CO_2$, $NH_3$, and combinations thereof may also be introduced. The $N_2O$ and the silicon containing gases may be introduced at a flow ratio of $N_2O$ to silicon containing gas of between about 20:1 to about 40:1. The hydrogen and nitrogen in a traditional silicon nitride capping layer used in silicon based TFTs semiconductor layers comprising silicon) may not have enough oxygen to balance the hydrogen and nitrogen effect on the TFT and may thus cause a negative shift in the threshold voltage. The oxygen content in the first capping layer 120 may be adjusted by controlling the ratio of $SiH_4$ to $N_2O$. The oxygen content should not be too high. If the oxygen content in the first capping layer 120 is too high, the on-current ($I_{on}$) or mobility may be significantly reduced. The high oxygen content may enlarge the area of the semiconductor layer that is damaged during the source-drain patterning of the strong positive charge on that top layer that could affect the electron movement under the electric field. In addition to the silicon containing gas and the $N_2O$ gas, nitrogen gas ($N_2$) may also be introduced.

In addition to the silicon containing gas and the $N_2O$ gas, $PH_3$ gas may be introduced. Hydrogen increases the mobility of the TFT. Thus, the $PH_3$ gas may increase the mobility of the TFT due to the hydrogen present in the $PH_3$ gas. However, hydrogen can cause the threshold voltage of the TFT to shift and become more negative. Thus, the amount of hydrogen that is present in the chamber during the first capping layer 120 deposition needs to be balanced to suit the needs of the user. For example, if the user is willing to sacrifice the threshold voltage, a higher mobility may be achieved. In one embodiment, the ratio of the $PH_3$ gas to the total hydrogen content of the gases introduced into the processing chamber may be between about 1:190 to about 1:200. When depositing a carbon containing first capping layer 120, the gases that may be introduced include $N_2$, $H_2$, and carbon containing gases such as $C_2H_2$.

After the first capping layer 120 has been deposited, the first capping layer 120 may be treated. One of the techniques involves exposing the first capping layer 120 to a plasma to passivate the surface of the first capping layer 120. In one embodiment, the first capping layer 120 may be exposed to a plasma comprising an oxygen containing gas such as $N_2O$ or $O_2$. In another embodiment, the first capping layer 120 may be exposed to a plasma comprising $H_2$, Ar, $N_2$, or $PH_3$ after exposure to the oxygen containing plasma. In another embodiment, the first capping layer 120 may be exposed to an oxygen containing gas in the absence of plasma such as $N_2O$, He, $H_2$, $N_2$, $O_2$, or combinations thereof. In another embodiment, the first capping layer 120 may be exposed to an oxygen containing plasma after exposure to an oxygen containing gas.

A second capping layer 122 may be deposited over the first capping layer 120. In one embodiment, the second capping layer 122 has a different composition than the first capping layer 120. In another embodiment, the second capping layer 122 has the same composition as the first capping layer 120. When the first capping layer 120 and the second capping layer 122 have the same composition, the first capping layer 120 and the second capping layer 122 may be deposited in a single deposition step. In one embodiment, the first capping layer 120 and the second capping layer 122 comprise a single layer deposited in a single processing step with a composition gradient that changes throughout the layer such that the oxygen content at the interface with the semiconductor layer 110 in the active channel 118 is higher than the oxygen content throughout the remainder of the layer. Of the collective thickness of the first and second capping layers 120, 122, the first capping layer may comprise about 5 percent to about 20 percent of the total thickness. In one embodiment, the thickness of the first capping layer 120 may be between about 75 Angstroms to about 125 Angstroms.

After the second capping layer 122 has been deposited, the second capping layer 122 may be treated. One of the techniques involves exposing the second capping layer 122 to a plasma to passivate the surface of the second capping layer 122. In one embodiment, the second capping layer 122 may be exposed to a plasma comprising an oxygen containing gas such as $N_2O$ or $O_2$. In another embodiment, the second capping layer 122 may be exposed to a plasma comprising $H_2$, Ar, $N_2$, or $PH_3$ after exposure to the oxygen containing plasma. In another embodiment, the second capping layer 122 may be exposed to an oxygen containing gas in the absence of plasma such as $N_2O$ or $O_2$. In another embodiment, the second capping layer 122 may be exposed to an oxygen containing plasma after exposure to an oxygen containing gas.

Figure 2:
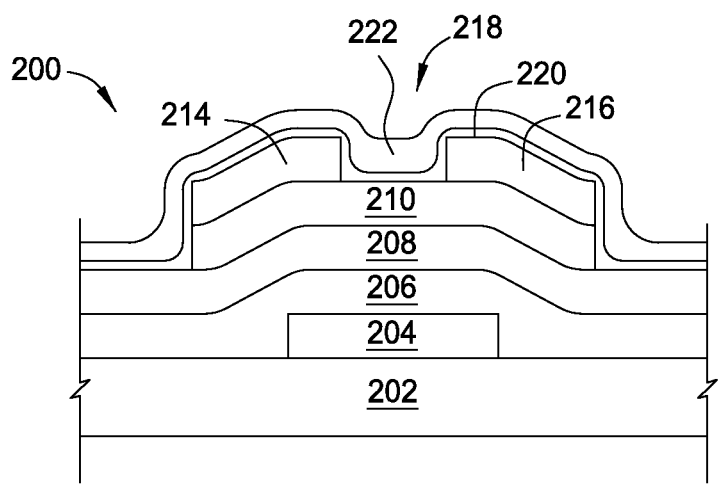
FIG. 2 is a schematic cross sectional view of a TFT 200 according to another embodiment of the invention.

FIG. 2 is a schematic cross sectional view of a TFT 200 according to another embodiment of the invention. The TFT 200 includes a gate electrode 204 disposed over a substrate 202. A first capping layer 220, a second capping layer 222, a source electrode 214, a drain electrode 216, an active channel 218, and a semiconductor layer 210 are also present. A multi layer gate dielectric is present. The gate dielectric may have a first gate dielectric layer 206 and a second gate dielectric layer 208. In one embodiment, the first gate dielectric layer 206 may comprise silicon nitride. In one embodiment, the second gate dielectric layer 208 may comprise silicon oxide. As noted above, silicon oxide, while not usable in silicon based TFTs, may be beneficial in metal oxide TFTs.

Figure 3:
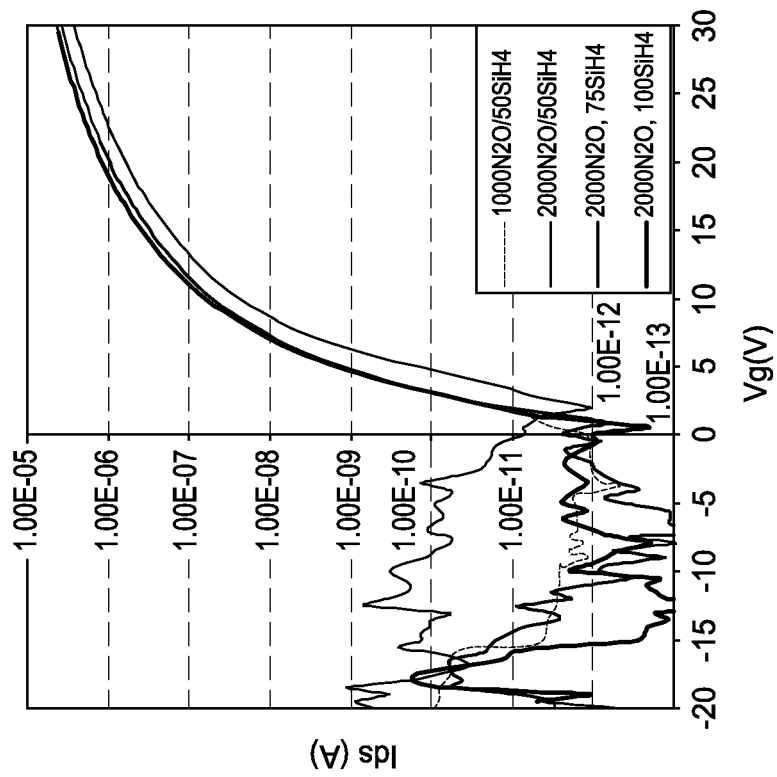
FIG. 3 is graph showing the effects of $N_2O$ and $SiH_4$ on the threshold voltage for a TFT according to one embodiment of the invention.

FIG. 3 is graph showing the effects of $N_2O$ and $SiH_4$ on the threshold voltage for a TFT according to one embodiment of the invention. The flow rates for the $N_2O$ and silane are shown as sccm. When the amount of silane is raised, the sub threshold slope improves as does the mobility. The mobility improves because of the increased hydrogen content. The $I_{off}$ current also is reduced with an increase in silane flow relative to the $N_2O$ flow. Lowering the $N_2O$ flow may not be sufficient as a decrease of the $N_2O$ flow by 10 percent (in the case of a 1000 sccm flow rate) will decrease the ratio of $N_2O$ flow to silane flow from about 20:1 to about 19:1 (assuming a flow rate of 50 sccm for silane). However, increasing the flow rate of silane by 10 percent (assuming a silane flow rate of 50 sccm) will decrease the ratio of $N_2O$ flow to silane flow from about 20:1 to about 18:1. When the ratio of $N_2O$ flow to silane is decreased, the sub threshold slope valve decreases and the mobility increases.

Figure 4:
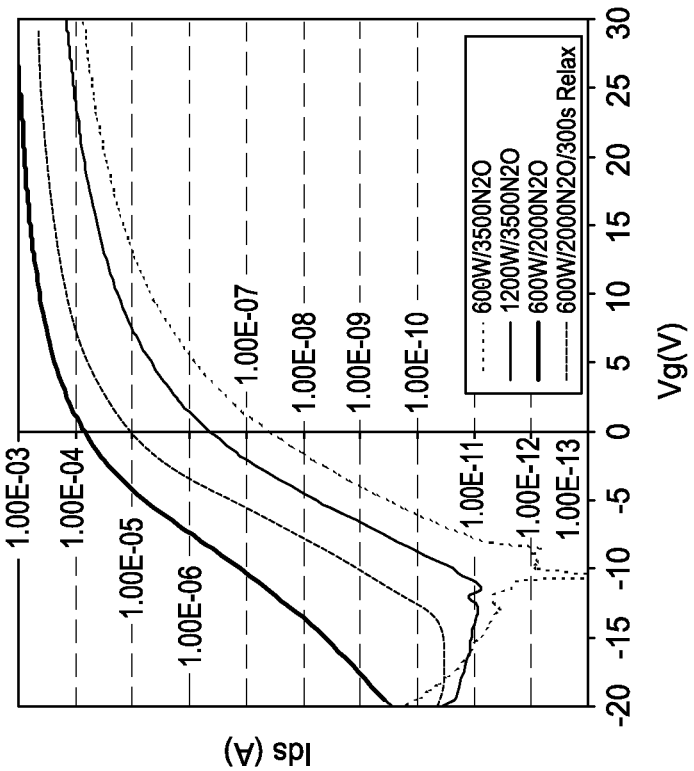
FIG. 4 is a graph showing the effect of the power applied to the showerhead and the ratio of $N_2O$ to $SiH_4$ on the threshold voltage for a TFT according to one embodiment of the invention.

FIG. 4 is a graph showing the effect of the power applied to the showerhead and the ratio of $N_2O$ to $SiH_4$ on the threshold voltage for a TFT according to one embodiment of the invention. The silane was flowed at a rate of 50 sccm in each case. The flow rates for the $N_2O$ are shown as sccm. While decreasing the ratio of $N_2O$ flow to silane flow increases mobility, it also increases the $I_{off}$ current and moves the threshold voltage to be more negative. However, increasing the power applied (and hence, the power density) will increase the mobility and lower the sub threshold slope, but the threshold voltage may be more negative. When relaxing (i.e., annealing at a temperature of the deposition for a period of time) after the capping layer deposition, the threshold voltage may become more positive and lower the sub threshold slope value, but the mobility is decreased slightly.

Figure 5:
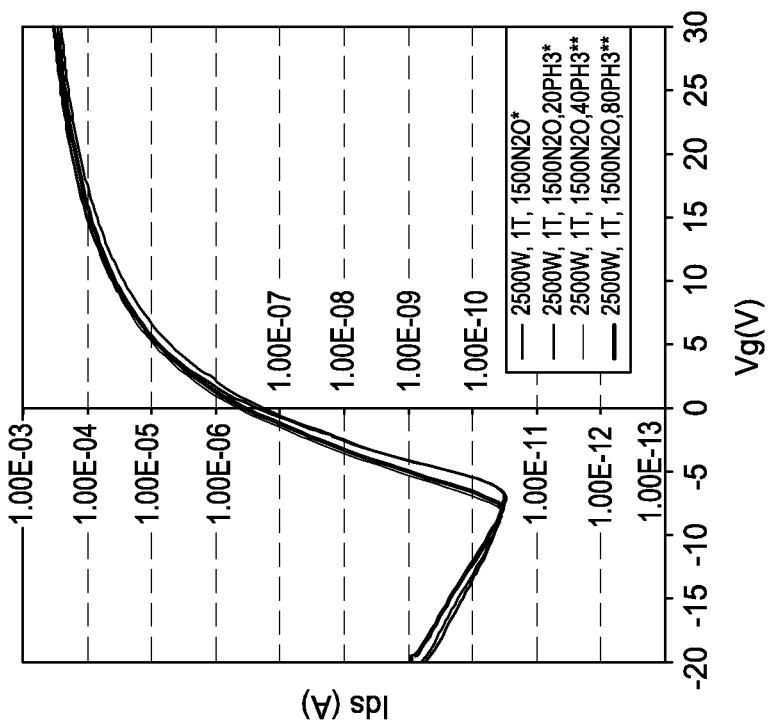
FIG. 5 is a graph showing the effect of $PH_3$ on the threshold voltage for a TFT according to one embodiment of the invention.

FIG. 5 is a graph showing the effect of $PH_3$ on the threshold voltage for a TFT according to one embodiment of the invention. The flow rates for the $N_2O$ and $PH_3$ are shown as sccm. A small ratio of $PH_3$ to total hydrogen content may increase mobility. However, if the ratio of $PH_3$ to total hydrogen content is too high, the threshold voltage may be more negative than would occur in the absence of the $PH_3$ with little to no change in the $I_{on}$ or mobility.

Figure 6B:
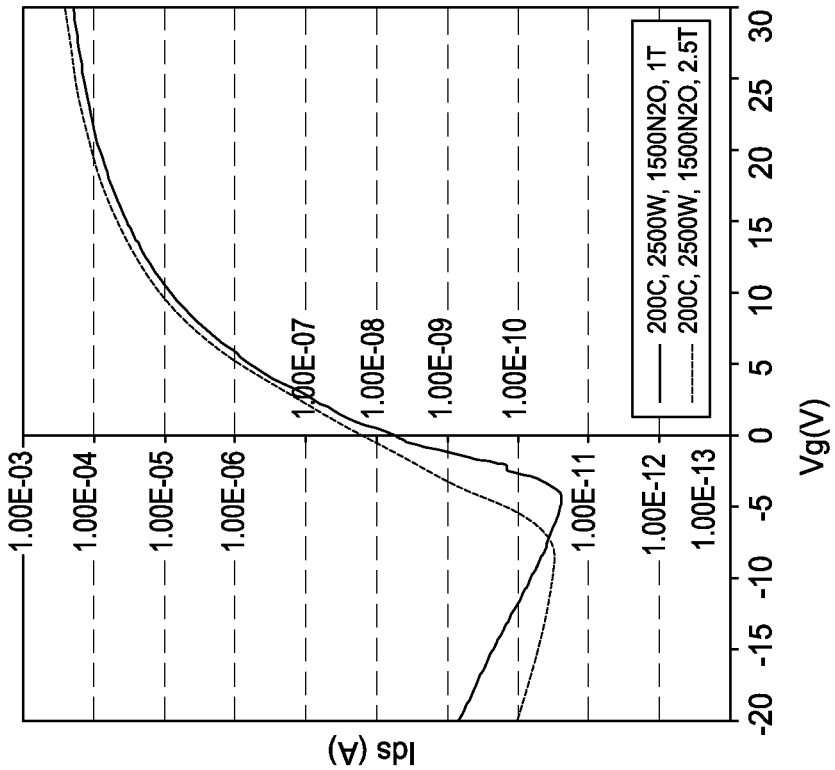
FIGS. 6A and 6B are graphs showing the effect of chamber pressure on the threshold voltage for a TFT according to one embodiment of the invention.
Figure 6A:
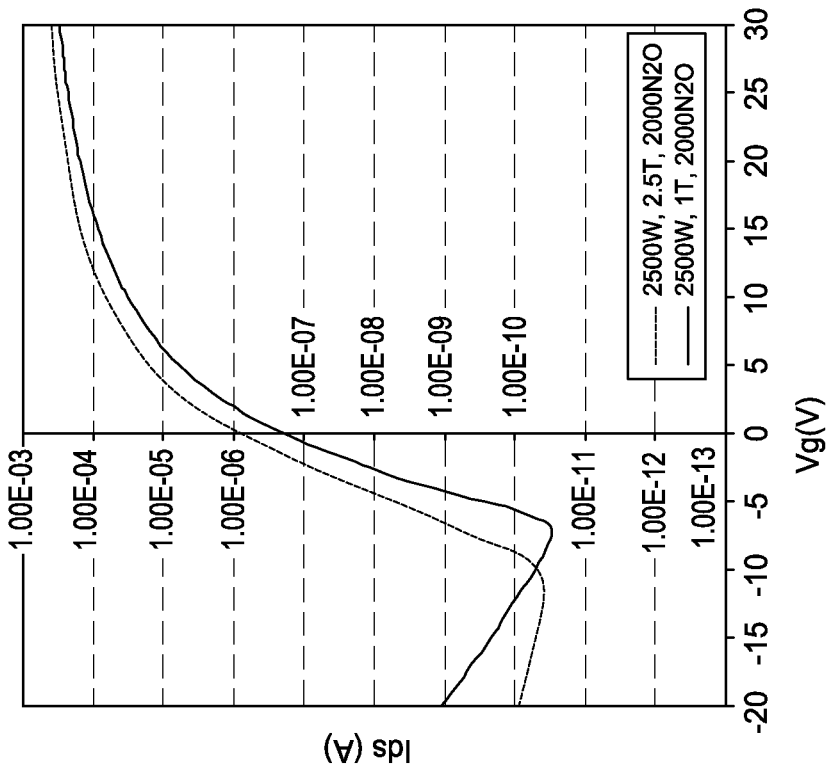

FIGS. 6A and 6B are graphs showing the effect of chamber pressure on the threshold voltage for a TFT according to one embodiment of the invention. The lower the chamber pressure, the lower the value for the sub threshold slope, but the $I_{off}$ tail is higher with the lower pressure.

Figure 7:
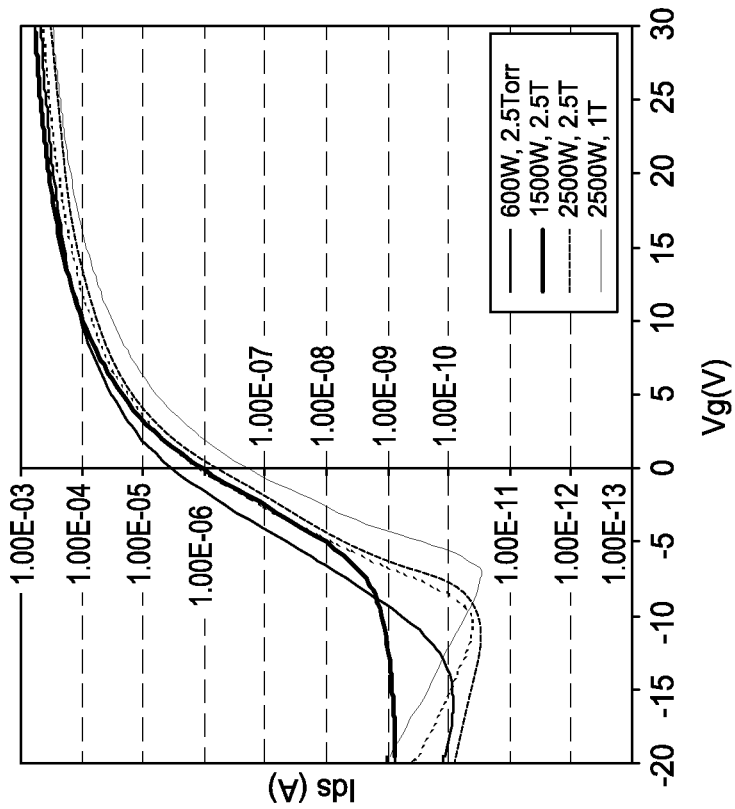
FIG. 7 is a graph showing the effect of both power and pressure on the threshold voltage for a TFT according to one embodiment of the invention.

FIG. 7 is a graph showing the effect of both power and pressure on the threshold voltage for a TFT according to one embodiment of the invention. The ratio of $N_2O$ to silane is constant for the data shown in FIG. 7. The power density affects the $I_{off}$ current, the threshold voltage, and the mobility. As shown in FIG. 7, the 1500 W data has the worst $I_{off}$ current. When holding power constant, the lower pressure provides the lowest $I_{off}$ current and a more positive threshold voltage.

Figure 8:
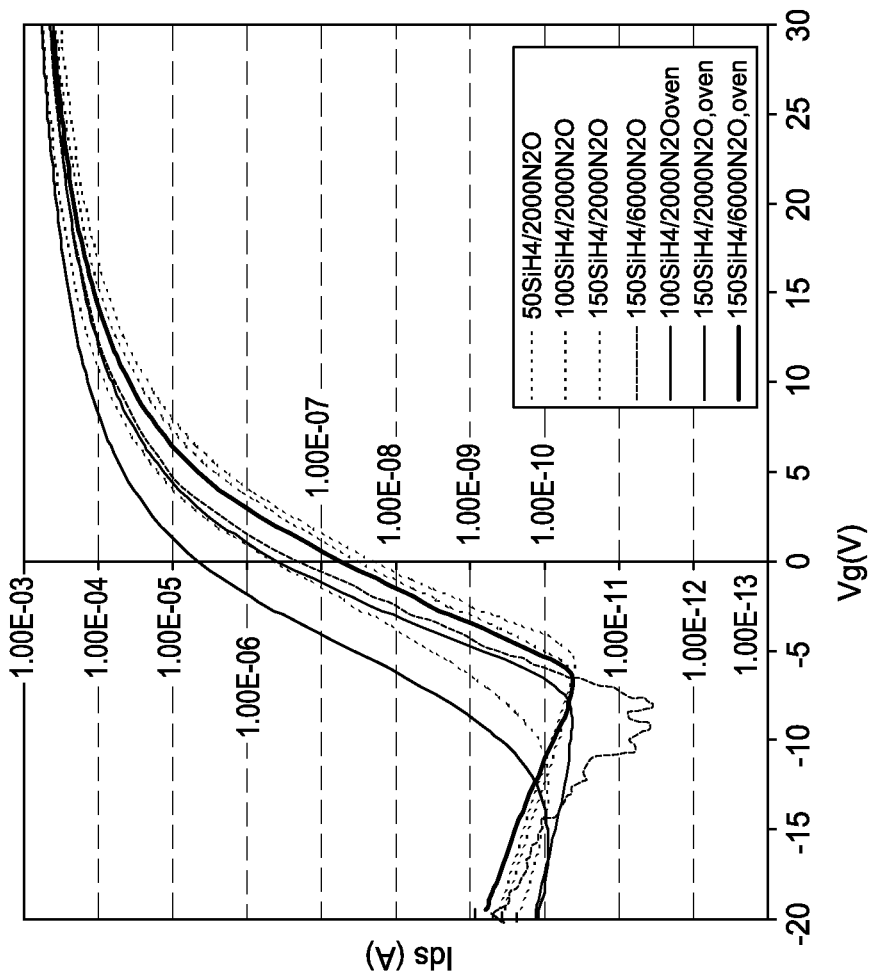
FIG. 8 is a graph showing the effect of annealing the capping layer in a TFT according to one embodiment of the invention.

FIG. 8 is a graph showing the effect of annealing the capping layer in a TFT according to one embodiment of the invention. A higher ratio of $N_2O$ to silane may move the threshold voltage in a more positive direction. A lower ratio of $N_2O$ to silane may move the threshold voltage more negative. The annealing shifts the threshold voltage to a more positive value. In one embodiment, the annealing may occur at a temperature between about 200 degrees Celsius to about 300 degrees Celsius.

Figure 9B:
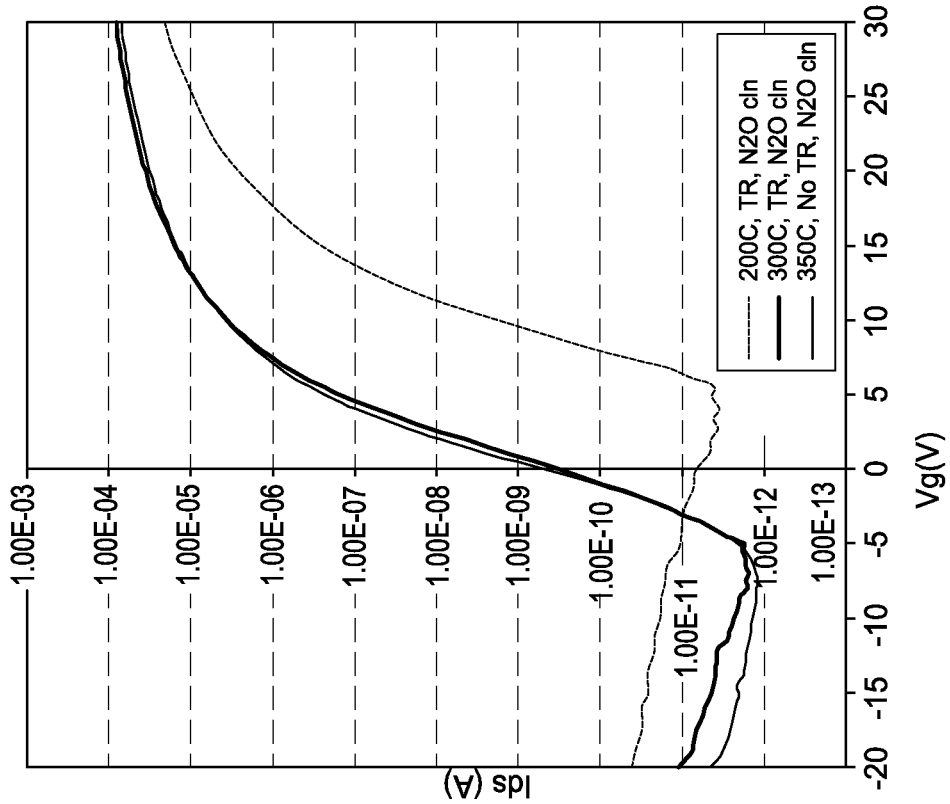
FIGS. 9A and 9B are graphs showing the effect of temperature on the threshold voltage for a TFT according to one embodiment of the invention.
Figure 9A:
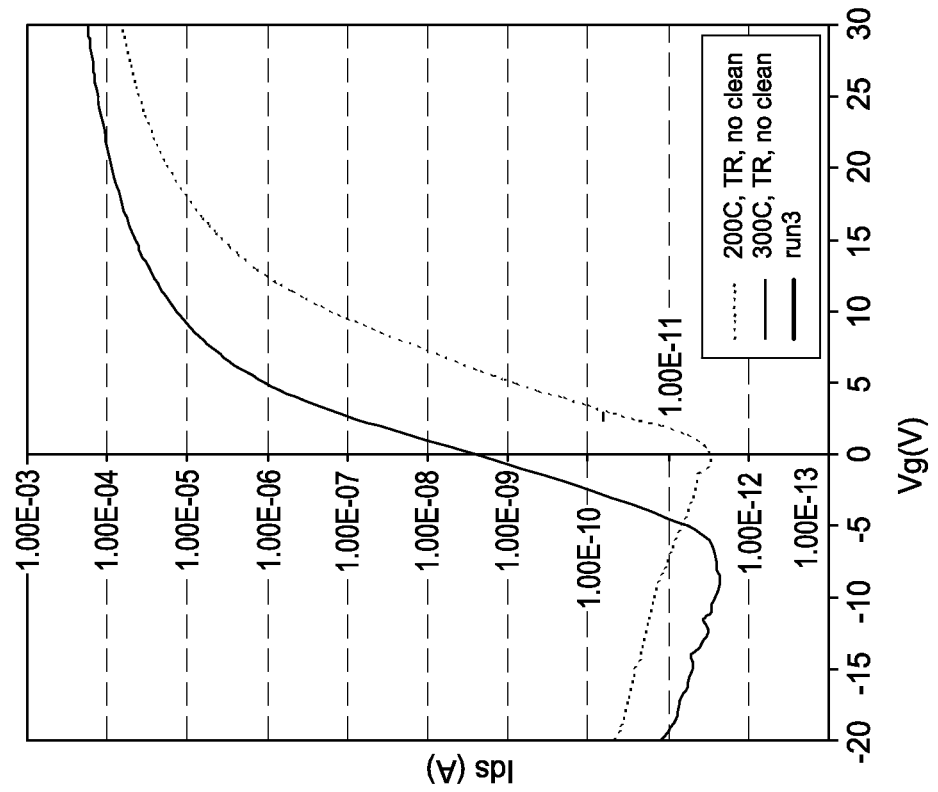

FIGS. 9A and 9B are graphs showing the effect of temperature on the threshold voltage for a TFT according to one embodiment of the invention. The higher the deposition temperature for the capping layer, the lower the $I_{off}$, the higher the mobility and the more negative the threshold voltage. Additionally, with higher capping layer deposition temperatures, the $I_{off}$ tail moves lower. The threshold voltage change is also smaller when the capping layer is not post treated.

Figure 10B:
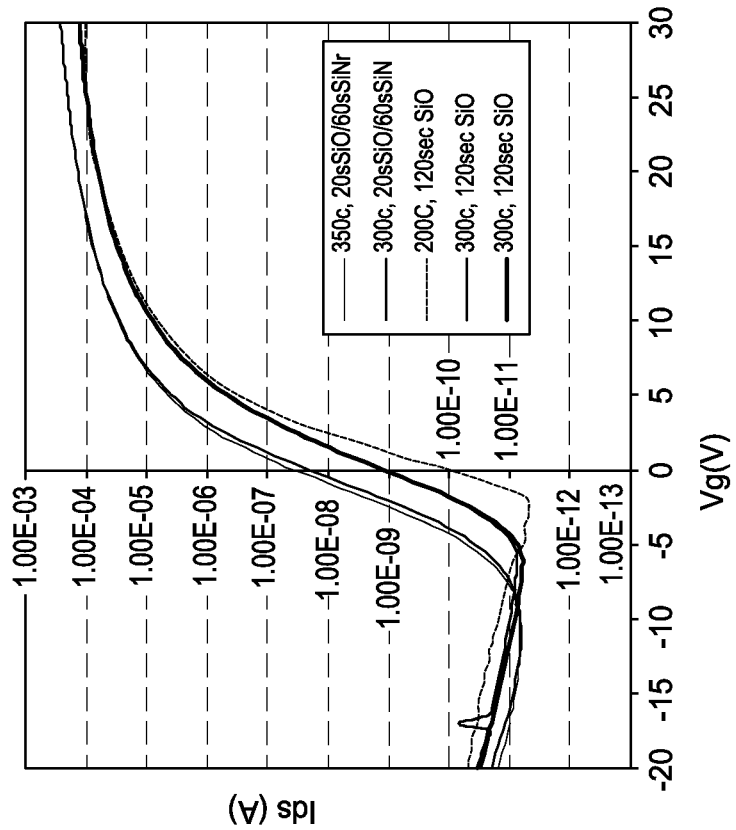
FIGS. 10A and 10B are graphs showing the effect of silicon nitride as the second capping layer according to one embodiment of the invention.
Figure 10A:
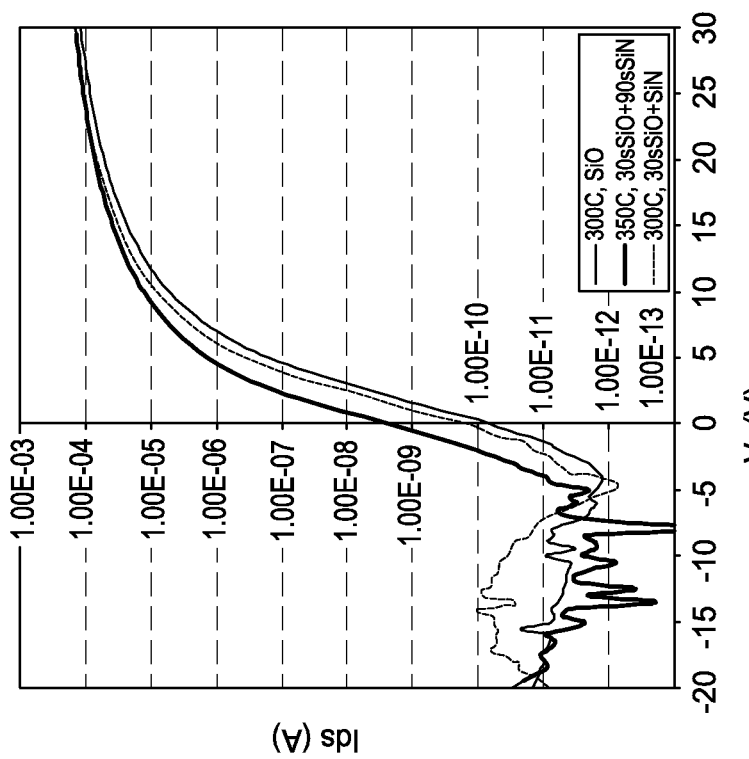

FIGS. 10A and 10B are graphs showing the effect of silicon nitride as the second capping layer according to one embodiment of the invention. The silicon nitride is deposited over an already deposited silicon oxide layer. In the embodiments shown in FIGS. 10A and 10B, the capping films are deposited for a total time period of about 120 seconds. When the silicon oxide film is deposited for 30 seconds and the silicon nitride film is deposited for 90 seconds, mobility may be increased. However, the silicon nitride may shift the threshold voltage to be more negative.

By controlling the oxygen, hydrogen, and nitrogen content as well as the temperature, pressure, and power density when depositing a capping film, the mobility, threshold voltage, $I_{on}$ current, $I_{off}$ current, and sub threshold slope may be optimized.

While the foregoing is directed to embodiments of the present invention, other and further embodiments of the invention may be devised without departing from the basic scope thereof, and the scope thereof is determined by the claims that follow.

The invention claimed is:

1. A thin film transistor fabrication method, the method comprising:
   depositing a semiconductor layer over a thin film transistor stack comprising a substrate, a gate electrode, and a gate dielectric layer, the semiconductor layer comprising:
   a compound comprising nitrogen, oxygen, zinc, indium and gallium; or
   a compound comprising nitrogen, oxygen, zinc and tin;
   depositing a conductive layer over the semiconductor layer;
   etching the conductive layer to define source and drain electrodes and to expose a portion of the semiconductor layer between the source and drain electrodes defined as the active channel; and
   depositing a capping layer over the exposed semiconductor layer by flowing $N_2O$ and $SiH_4$ gas into a processing chamber at a ratio of $N_2O$ and $SiH_4$ of between about 20:1 to about 40:1.

2. The method of claim 1, further comprising flowing $N_2$ gas along with the $N_2O$ and $SiH_4$ gases.

3. The method of claim 1, wherein the capping layer comprises silicon oxide.

4. The method of claim 3, further comprising a silicon nitride layer deposited on the silicon oxide capping layer.

5. The method of claim 1, wherein the capping layer comprises a plurality of layers with silicon oxide deposited adjacent the semiconductor layer.

6. The method of claim 1, further comprising exposing the gate dielectric layer to one or more of $N_2O$ gas or a plasma formed from $N_2O$ gas.

7. The method of claim 1, wherein the semiconductor layer is deposited by sputtering.

8. The method of claim 7, wherein the semiconductor layer comprises a dopant.

9. A thin film transistor fabrication method, the method comprising:
   depositing a semiconductor layer over a thin film transistor stack comprising a substrate, a gate electrode, and a gate dielectric layer, the semiconductor layer comprising:
   a compound comprising nitrogen, oxygen, zinc, indium and gallium; or
   a compound comprising nitrogen, oxygen, zinc and tin;
   depositing a conductive layer over the semiconductor layer;
   etching the conductive layer to define source and drain electrodes and to expose a portion of the semiconductor layer between the source and drain electrodes defined as the active channel; and
   depositing a capping layer over the exposed semiconductor layer by flowing $N_2O$ and $SiH_4$ gas into a processing chamber at a ratio of $N_2O$ and $SiH_4$ of between about 20:1 to about 40:1 and flowing $PH_3$ gas along with the $N_2O$ and $SiH_4$ gases.

10. The method of claim 9, wherein a ratio of $PH_3$ gas to a total amount of hydrogen flowed into the processing chamber is between about 1:1000 to about 1:150.

11. A thin film transistor fabrication method, the method comprising:
   depositing a semiconductor layer over a thin film transistor stack comprising a substrate, a gate electrode, and a gate dielectric layer, the semiconductor layer comprising:
   a compound comprising nitrogen, oxygen, zinc, indium and gallium; or
   a compound comprising nitrogen, oxygen, zinc and tin;
   depositing a conductive layer over the semiconductor layer;
   etching the conductive layer to define source and drain electrodes and to expose a portion of the semiconductor layer between the source and drain electrodes defined as the active channel; and
   depositing a silicon oxide layer over the exposed semiconductor layer in the active channel to partially fill the active channel, the depositing comprising flowing $N_2O$, $SiH_4$, and $PH_3$ gas into a processing chamber to obtain a chamber pressure of about 500 mTorr to about 2.5 Torr and applying an RF bias and to a gas distribution showerhead in the processing chamber is between about $1.16 \times 10^{-6}$ W/cm$^2$ to about $4.63 \times 10^{-3}$ W/cm$^2$.

12. The method of claim 11, wherein a flow ratio of $N_2O$ and $SiH_4$ is between about 20:1 to about 40:1.

13. The method of claim 12, wherein a ratio of $PH_3$ gas to a total amount of hydrogen flowed into the processing chamber is between about 1:1000 to about 1:150.

14. The method of claim 11, further comprising flowing $N_2$ gas along with the $N_2O$ and $SiH_4$ gases.

15. The method of claim 11, further comprising exposing the gate dielectric layer to one or more of $N_2O$ gas or a plasma formed from $N_2O$ gas.

16. The method of claim 11, wherein the semiconductor layer is deposited by sputtering.

17. The method of claim 16, wherein the silicon oxide layer is deposited at a temperature between about 200 degrees Celsius and about 350 degrees Celsius.

* * * * *

UNITED STATES PATENT AND TRADEMARK OFFICE
CERTIFICATE OF CORRECTION

PATENT NO. : 8,809,132 B2
APPLICATION NO. : 13/215013
DATED : August 19, 2014
INVENTOR(S) : Ye It is certified that error appears in the above-identified patent and that said Letters Patent is hereby corrected as shown below:

In the Specification,

Column 4, Line 27, please delete "TFTs TFTs" and insert -- TFTs (i.e., TFTs -- therefor;

Column 6, Line 31, please delete "TFTs semiconductor" and insert -- TFTs (i.e., semiconductor -- therefor.

Signed and Sealed this
Twenty-third Day of December, 2014

Michelle K. Lee
*Deputy Director of the United States Patent and Trademark Office*